US012610467B2

(12) United States Patent
Chen et al.

(10) Patent No.: US 12,610,467 B2
(45) Date of Patent: Apr. 21, 2026

(54) SPLICED PRESSURE SENSING DEVICE AND SPLICABLE PRESSURE SENSING UNIT THEREOF

(71) Applicant: TAIWAN ALPHA ELECTRONIC CO., LTD., Taoyuan City (TW)

(72) Inventors: Shuo-Tsan Chen, Taoyuan City (TW); Hsin-Tsun Tsai, Taoyuan City (TW); Hung-Hsiang Li, Taoyuan City (TW)

(73) Assignee: TAIWAN ALPHA ELECTRONIC CO., LTD., Taoyuan City (TW)

( * ) Notice: Subject to any disclaimer, the term of this patent is extended or adjusted under 35 U.S.C. 154(b) by 242 days.

(21) Appl. No.: 18/627,632

(22) Filed: Apr. 5, 2024

(65) Prior Publication Data

US 2025/0227843 A1 Jul. 10, 2025

(30) Foreign Application Priority Data

Jan. 4, 2024 (TW) ................................ 113100415

(51) Int. Cl.
| | |
|---|---|
| *H05K 1/11* | (2006.01) |
| *H01R 12/78* | (2011.01) |
| *H05K 1/18* | (2026.01) |
| *H05K 1/189* | (2026.01) |
| *G01L 9/00* | (2006.01) |

(52) U.S. Cl.
CPC ............. *H05K 1/118* (2013.01); *H01R 12/78* (2013.01); *H05K 1/189* (2013.01); *G01L*

*9/0001* (2013.01); *H05K 2201/058* (2013.01); *H05K 2201/10151* (2013.01)

(58) Field of Classification Search
CPC .. H05K 1/118; H05K 1/189; H05K 2201/058; H05K 2201/10151; H01R 12/78
See application file for complete search history.

(56) References Cited

U.S. PATENT DOCUMENTS

2022/0136914 A1* 5/2022 Kim ........................ G01L 1/205
                                                   338/47
2023/0073404 A1* 3/2023 Kim ........................ G01L 1/205

* cited by examiner

*Primary Examiner* — Sherman Ng
(74) *Attorney, Agent, or Firm* — MUNCY, GEISSLER, OLDS & LOWE, P.C.

(57) ABSTRACT

A spliced pressure sensing device includes a plurality of splicable pressure sensing units and a flexible connecting component. The splicable pressure sensing unit includes a first flexible circuit board, a flexible spacer layer and a second flexible circuit board. The first flexible circuit board has a plurality of first circuits extending. The flexible spacer layer has a plurality of through holes and air escape channels, each of the air escape channels communicating with at least one of the through holes. The second flexible circuit board has a plurality of second circuits, the second sensing contacts of the second circuits aligned with the first sensing contacts of the first circuits through the through holes. The second flexible circuit board has a plurality of second circuits, the second sensing contacts of the second circuits aligned with the first sensing contacts of the first circuits through the through holes. The flexible connecting component is used to connect the first circuit with the second circuit after multiple splicable pressure sensing units are spliced into a spliced pressure sensing device body.

11 Claims, 5 Drawing Sheets

SPLICED PRESSURE SENSING DEVICE AND SPLICABLE PRESSURE SENSING UNIT THEREOF

This application claims the benefit of Taiwan Patent Application Serial No. 113100415, filed on Jan. 4, 2024, the subject matter of which is incorporated herein by reference.

BACKGROUND OF THE INVENTION

(1) Field of the Invention

The invention relates to a pressure sensing device, most particularly to a spliced pressure sensing device and a splicable pressure sensing unit thereof.

(2) Description of the Prior Art

In recent years, because of the rise of people's self-awareness, more and more people pay more attention to life experience. Therefore, the development of technology is oriented to provide users with a better experience.

In daily life, in order to provide users with a more comfortable experience, most devices will cooperate with sensors to provide some feedback. For example, thin film pressure sensors will be installed on seats to sense the pressure distribution when the user is sitting and then analyze the user's sitting posture to make corresponding adjustments.

As mentioned above, in addition to installing pressure sensing devices on seats and other items to sense the user's pressure, there are also related applications that use pressure sensing devices to detect the user's movements, such as installing pressure sensing devices on wearable items to cooperate with technologies such as virtual reality by detecting the user's movements.

In addition, the pressure sensing device can also be used in detection applications such as medical mattresses, horizontal tightness detection between rollers, tooth bite identification, tire level detection or warehouse storage etc. This helps medical professionals, warehouse managers and technicians to intuitively identify defective points and shorten product design and change time.

As mentioned above, the application fields of pressure sensing devices are extremely wide. Therefore, the most common problem encountered is that the required sensing ranges are different in size. As a result, in practice, it is often necessary to design different scales of pressure sensing devices for different sensing projects. The pressure sensing device not only cannot adjust the sensing range quickly and flexibly, but also needs to be re-designed and re-manufactured, making it very inconvenient to use.

SUMMARY OF THE INVENTION

In view of the prior art, the sensing range of the pressure sensing devices is mostly a fixed range, it is often necessary to re-design the product for different applications to change the sensing range, and it cannot adjust the range that needs to be sensed immediately, which is very inconvenience. Therefore, the main object of the present invention is to provide a splicable pressure sensing device and its splicable pressure sensing unit, which can adjust the sensing range by splicing multiple splicable pressure sensing units.

In order to solve the problem of the prior art, the necessary technical means adopted by the present invention is to provide a splicable pressure sensing device, which includes a plurality of splicable pressure sensing units and a flexible connecting component.

Each of the splicable pressure sensing units respectively includes a first flexible circuit board, a flexible spacer layer and a second flexible circuit board.

The first flexible circuit board has a plurality of first circuits extending along a first direction, and each of the first circuits has a first end contact, a second end contact and a plurality of first sensing contacts connecting with the first end contact and the second end contact in series.

The flexible spacer layer has a first adherence surface and a second adherence surface opposite to each other. The first adherence surface is adhered to the first flexible circuit board. The flexible spacer layer has a plurality of through holes and a plurality of air escape channels through the first adherence surface and the second adherence surface. Each of the air escape channels respectively communicates with one of the through holes, and each of the first sensing contacts is respectively aligned with corresponding one of the through holes.

The second flexible circuit board is adhered to the second adherence surface and has a plurality of second circuits extending along a second direction perpendicular to the first direction. Each of the second circuits has a third end contact, a fourth end contact and a plurality of second sensing contacts connecting with the third end contact and the fourth end contact in series. Each of the second sensing contacts is respectively aligned with corresponding one of the first sensing contacts through one of the through holes.

The flexible connecting component has a plurality of first circuit contacts and a plurality of second circuit contacts, and is used to connect at least two of the splicable pressure sensing units adjacent to each other after at least two of the splicable pressure sensing units are spliced into a spliced pressure sensing device body. The first circuit contacts electrically connect with the first circuits, and the second circuit contacts electrically connect with the second circuits.

Wherein, in the spliced pressure sensing device body, all of the first circuits electrically connect with each other, and all of the second circuits electrically connect with each other.

In an ancillary technical means derived from the above necessary technical means, the first flexible circuit board further includes a plurality of first air escape holes, and each of the first air escape holes respectively communicates with one of the air escape channels.

Preferably, the second flexible circuit board further includes a plurality of second air escape holes, and each of the second air escape holes respectively communicates with one of the air escape channels.

In an ancillary technical means derived from the above necessary technical means, the first flexible circuit board is extended from a first side to a second side along the first direction. The first end contact and the second end contact of each of the first circuits are respectively arranged on the first side and the second side. The first flexible circuit board further includes a third side and a fourth side, and the third side and the fourth side respectively connect with two ends of the first side and the second side. The third side further has a first notch, and the fourth side further has a second notch. The third end contact of each of the second circuits is exposed from the first notch, and the fourth end contact of each of the second circuits is exposed from the second notch.

Preferably, the second flexible circuit board is extended from a fifth side to a sixth side along the second direction. The third end contact and the fourth end contact of each of the second circuits are respectively arranged on the fifth side and the sixth side. The second flexible circuit board further includes a seventh side and an eighth side. The seventh side and the eighth side respectively connect with two ends of the fifth side and the sixth side. The seventh side further has a third notch, and the eighth side further has a fourth notch. The first end contact of each of the first circuits is exposed from the third notch, and the second end contact of each of the first circuits is exposed from the fourth notch.

In an ancillary technical means derived from the above necessary technical means, the flexible connecting component comprises at least one first connecting strap and at least one second connecting strap. The first connecting strap is extended along the first direction, having the plurality of first circuit contacts, and the second connecting strap, connected with at least one of the first connecting strap, is extended along the second direction, having the plurality of second circuit contacts.

The necessary technical means adopted by the present invention is to provide a splicable pressure sensing unit.

As mentioned above, the splicable pressure sensing unit is comprised of the first flexible circuit board, the flexible spacer layer and the second flexible circuit board, the first circuits of the first flexible circuit board extending along the first direction, the second circuits of the second flexible circuit board extending along the second direction perpendicular to the first direction. Therefore, the splicable pressure sensing unit can be spliced to the first flexible circuit boards of other splicable pressure sensing units in the first direction through the first flexible circuit board, so that multiple first circuits are connected to each other. Similarly, splicing can also be performed on the second flexible circuit board in the second direction, thereby enabling the splicable pressure sensing unit to have a wide variety of splicing combinations to expand the performance, effectively allowing users to adjust the sensing range by their needs. Then, respectively connecting all the first circuits and all the second circuits through the flexible connecting component forms a spliced pressure sensing device with a large sensing range.

All these objects are achieved by the spliced pressure sensing device and its splicable pressure sensing unit described below.

BRIEF DESCRIPTION OF THE DRAWINGS

The present invention will now be specified with reference to its preferred embodiment illustrated in the drawings, in which.

4 which is composed of four splicable pressure sensing units, and the flexible connecting component.

DESCRIPTION OF THE PREFERRED EMBODIMENT

Figure 1:
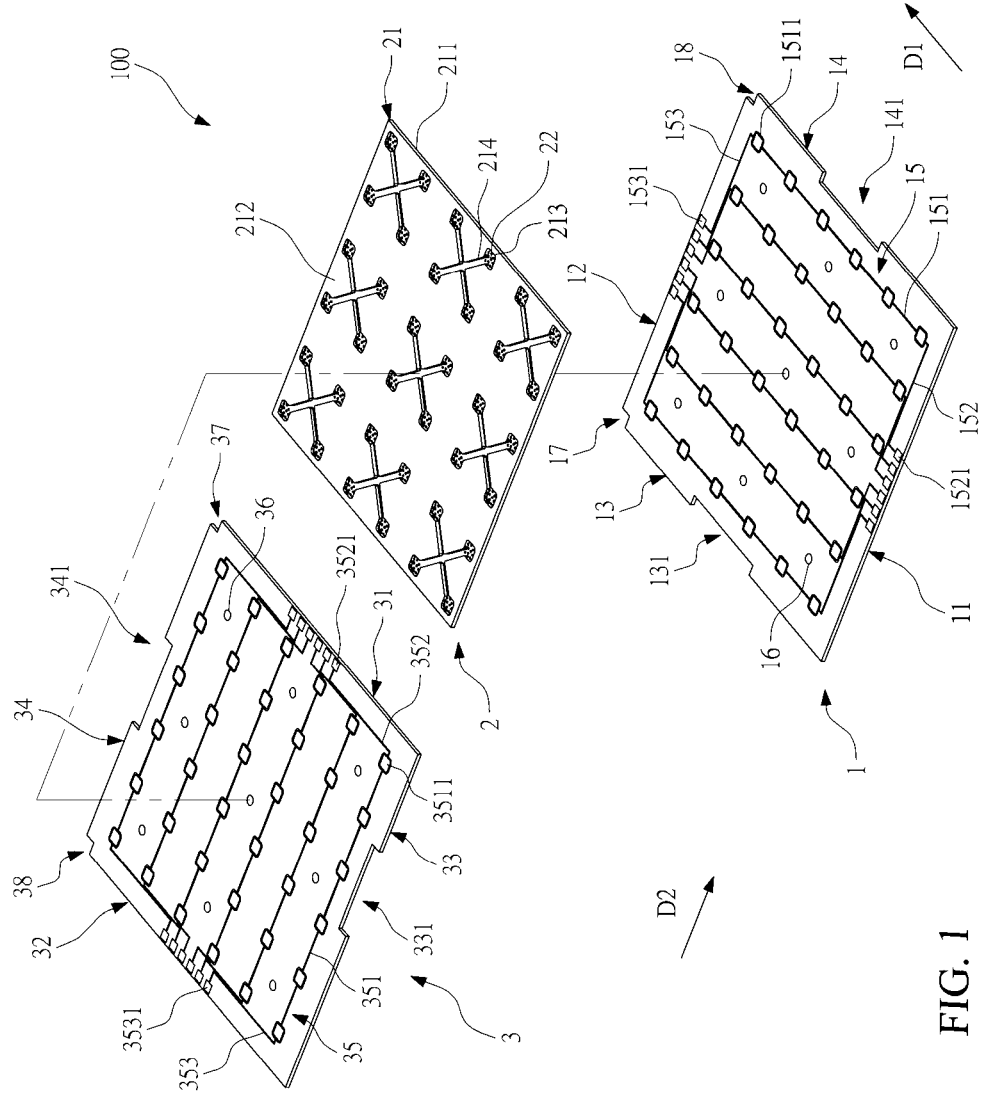
FIG. 1 illustrates a three-dimensional exploded schematic diagram of the splicable pressure sensing unit of the present invention.
Figure 2:
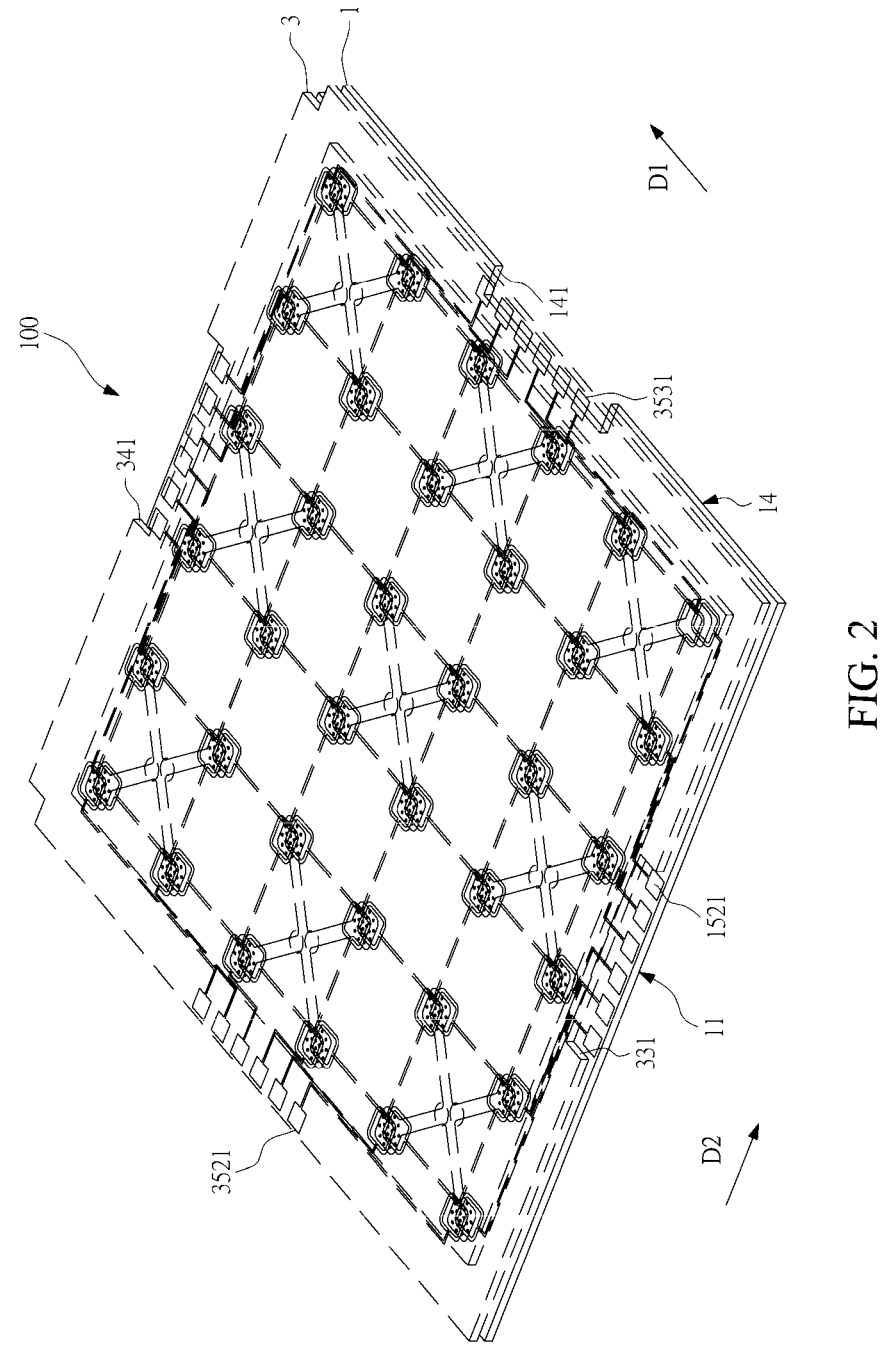
FIG. 2 illustrates a three-dimensional schematic diagram of the splicable pressure sensing unit of the present invention.
Figure 3:
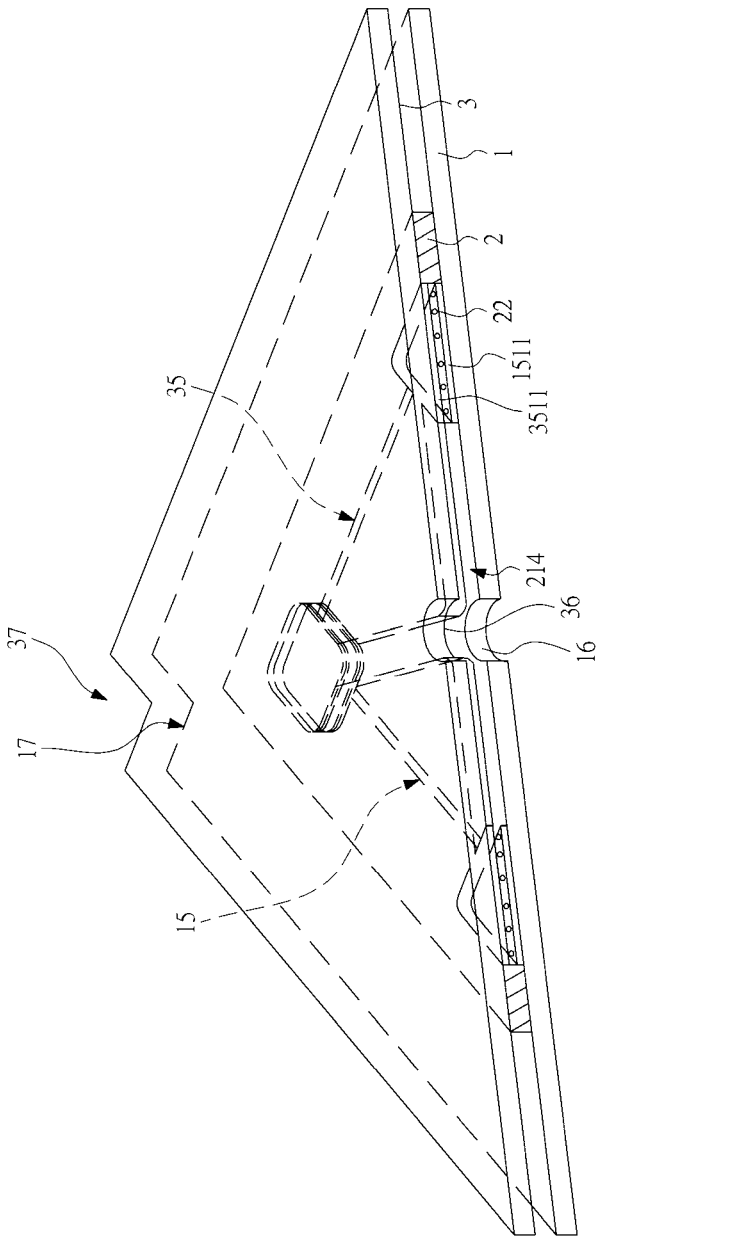
FIG. 3 is a partial cross-sectional schematic diagram illustrating the splicable pressure sensing unit of the present invention.

Referring to FIG. 1 to FIG. 3, where FIG. 1 illustrates a three-dimensional exploded schematic diagram of the splicable pressure sensing unit of the present invention, FIG. 2 illustrates a three-dimensional schematic diagram of the splicable pressure sensing unit of the present invention, and FIG. 3 is a partial cross-sectional schematic diagram illustrating the splicable pressure sensing unit of the present invention. As shown in FIG. 1 to FIG. 3, a spliced pressure sensing device 100 comprises a first flexible circuit board 1, a flexible spacer layer 2 and a second flexible circuit board 3.

The first flexible circuit board 1 has a first side 11, a second side 12, a third side 13, a fourth side 14, six first circuits 15 (only one shown in the figure), nine first air escape holes 16 (only one shown in the figure) and two first positioning structures 17, 18. Among these, the first flexible circuit board 1 extends from the first side 11 to the second side 12 along a first direction D1, and the third side 13 and the fourth side 14 are respectively extended from both ends of the first side 11 to both ends of the second side 12 along a second direction D2 perpendicular to the first direction D1.

Each of the first circuits 15 includes a first circuit body 151, a first extension circuit 152 and a second extension circuit 153. The first circuit body 151 of each of the first circuits 15 is independent of each other and extends along the first direction D1 respectively, and has six first sensing contacts 1511 connected in series with each other (only one shown in the figure). The first extension circuit 152 integrally extends from an end of the first circuit body 151 adjacent to the first side 11 to the first side 11 to form a first end contact 1521. The second extension circuit 153 integrally extends from an end of the first circuit body 151 adjacent to the second side 12 to the second side 12 to form a second end contact 1531. The third side 13 is further provided with a first notch 131, and the fourth side 14 is further provided with a second notch 141. Additionally, since there are six first circuits 15 in the present embodiment and each of the first circuits 15 has six first sensing contacts 1511, the entire first flexible circuit board 1 has a total of thirty-six first sensing contacts 1511.

Nine first air escape holes 16 are evenly distributed among thirty-six first sensing contacts 1511, so that each of the first sensing contacts 1511 can be adjacent to one first air escape hole 16.

The first positioning structure 17 is disposed on the intersection of the second side 12 and the third side 13, and the first positioning structure 18 is disposed on the intersection of the second side 12 and the fourth side 14.

The flexible spacer layer 2 includes a flexible spacer layer body 21 and a plurality of spacers 22 (only one shown in the figure). The flexible spacer layer 21 has a first adherence surface 211 and a second adherence surface 212 opposite to each other. The first adherence surface 211 is used to be adhered to the first flexible circuit board 1. The flexible spacer layer 2 has a plurality of through holes 213 (thirty-six in the present embodiment) and a plurality of air escape channels 214 (thirty-six in the present embodiment) through the first adherence surface 211 and the second adherence surface 212. Each of the first sensing contacts 1511 is respectively aligned with corresponding one of the through holes 213. That is to say, in the present embodiment, thirty-six first sensing contacts 1511 respectively correspond to thirty-six through holes 213.

Additionally, the air escape channels 214 respectively communicates with one through hole 214. In the present embodiment, each four air escape channels 214 are connected to each other to form an X-shaped structure, so that each through hole 213 is connected to the other three through holes 213 through four air escape channels 214. When the flexible spacer layer 2 is adhered to the first flexible circuit board 1 via the first adherence surface 211, each of the first air escape holes 16 further corresponds to the intersection of each of the four interconnected air escape channels 214, so that each of the air escape channels 214 can be connected to one first air escape hole 16.

A plurality of spacers 22 are spaced apart from each other in each through holes 213 and are respectively disposed on the first sensing contact 1511. In the present embodiment, the spacer 22, for example, is a spherical particle structure.

The second flexible circuit board 3 is adhered to the second adherence surface 212 and has a fifth side 31, a sixth side 32, a seventh side 33, an eighth side 34, six second circuits 35 (only one shown in the figure), nine second air escape holes 36 (only one shown in the figure) and two second positioning structures 37, 38. Among these, the second flexible circuit board 3 extends from the fifth side 31 to the sixth side 32 along the second direction D2. In FIG. 1, the second flexible circuit board 3 is in a horizontally inverted state compared to the first flexible circuit board 1 and the flexible spacer layer 2. Therefore, the extension direction presented by the first direction D1 based on the first flexible circuit board 1 will be opposite to the extension direction based on the second flexible circuit board 3. The seventh side 33 and the eighth side 34 are respectively extended from both ends of the fifth side 31 to both ends of the sixth side 32 along the first direction D1.

Each of the second circuits 35 includes a second circuit body 351, a third extension circuit 352 and a fourth extension circuit 353. The second circuit body 351 of each of the second circuits 35 is independent of each other and extends along the second direction D2 respectively, and has six second sensing contacts 3511 connected in series with each other (only one shown in the figure). The third extension circuit 352 integrally extends from an end of the second circuit body 351 adjacent to the fifth side 31 to the fifth side 31 to form a third end contact 3521. The fourth extension circuit 353 integrally extends from an end of the second circuit body 351 adjacent to the sixth side 32 to the sixth side 32 to form a fourth end contact 3531. The seventh side 33 is further provided with a third notch 331, and the eighth side 34 is further provided with a fourth notch 341. Additionally, since there are six second circuits 35 in the present embodiment and each of the second circuits 35 has six second sensing contacts 3511, the entire second flexible circuit board 3 has a total of thirty-six second sensing contacts 3511.

As mentioned above, when the flexible spacer layer 2 is adhered to the first flexible circuit board 1 and the second flexible circuit board 3 is adhered to the flexible spacer layer 2, each of the second sensing contacts 3511 is respectively aligned with the corresponding one of the first sensing contacts 1511 through the corresponding one of the through holes 213. Additionally, the first end contact 1521 of each of the first circuits 15 is exposed from the third notch 331, the second end contact 1531 of each of the first circuits 15 is exposed from the fourth notch 341, the third end contact 3521 of each of the second circuits 35 is exposed from the first notch 131, and the fourth end contact 3531 of each of the second circuits 35 is exposed from the second notch 141.

Nine second air escape holes 36 are evenly distributed among thirty-six second sensing contacts 3511, so that each of the second sensing contacts 3511 can be adjacent to one second air escape hole 36.

The second positioning structure 37 is disposed on the intersection of the eighth side 34 and the fifth side 31, and the second positioning structure 38 is disposed on the intersection of the eighth side 34 and the sixth side 32. When the first flexible circuit board 1 and the second flexible circuit board 3 are respectively adhered to the first adherence surface 211 and the second adherence surface 212 of the flexible spacer layer 2, the first positioning structures 17, 18 can be aligned with the second positioning structures 37, 38 respectively, so that the first circuits 15 and the second circuits 35 are arranged perpendicularly and staggered to each other, thereby forming a grid-shaped pressure sensing circuit structure.

Additionally, when the second flexible circuit board 2 is adhered to the second adherence surface 212 of the flexible spacer layer 2, each of the second air escape holes 36 further corresponds to the intersection of each of the four interconnected air escape channels 214 aforementioned, so that each of the air escape channels 214 can be connected to one second air escape hole 36, and each of the second air escape holes 36 can also be connected to the corresponding first air escape hole 16 through the corresponding air escape channel 214.

It should be noted that, in the present embodiment, the board bodies of the first flexible circuit board 1 and the second flexible circuit board 3 and the flexible spacer layer body 21 are, in practice, insulators composed of, for example, thermoplastic polyurethane (TPU). The first circuits 15 and the second circuits 35 are formed of, for example, conductive materials through printing, and the spacer 22 may, in practice, be an insulating material such as double-sided tape that is adhered and fixed between the first sensing contact 1511 and the second sensing contact 3511.

Figure 4:
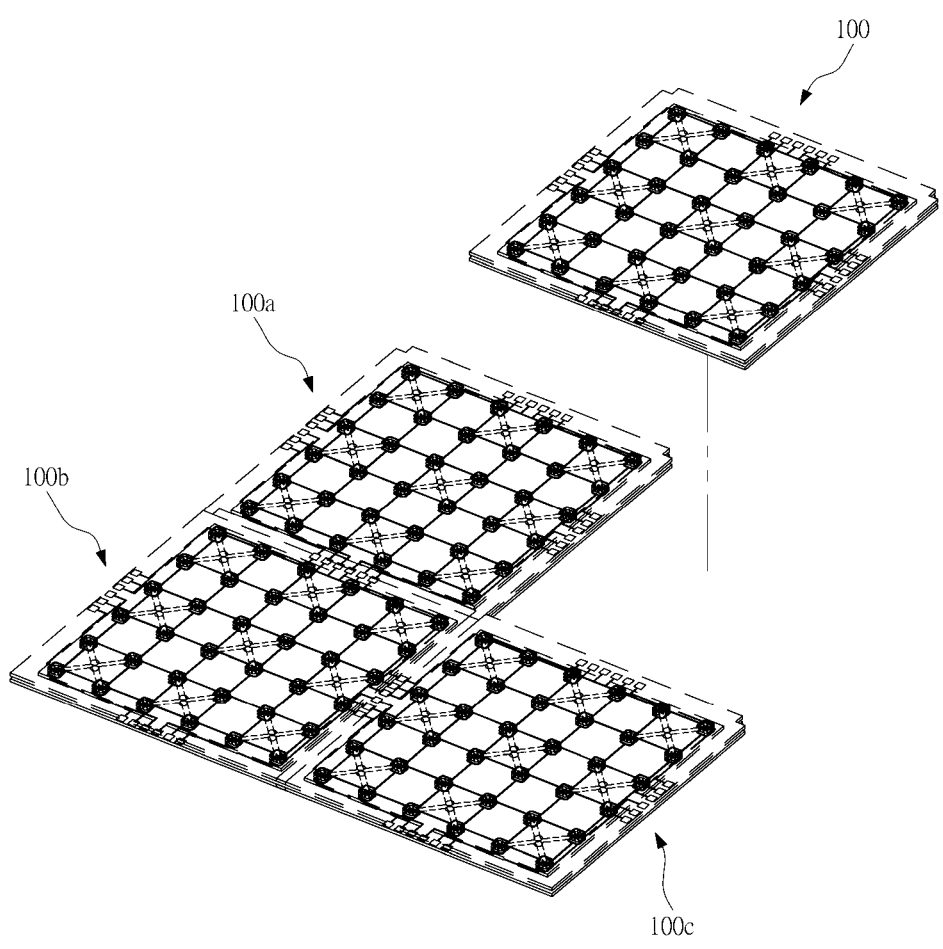
FIG. 4 is a three-dimensional exploded schematic diagram illustrating a plurality of splicable pressure sensing units of the present invention being spliced to each other.
Figure 5:
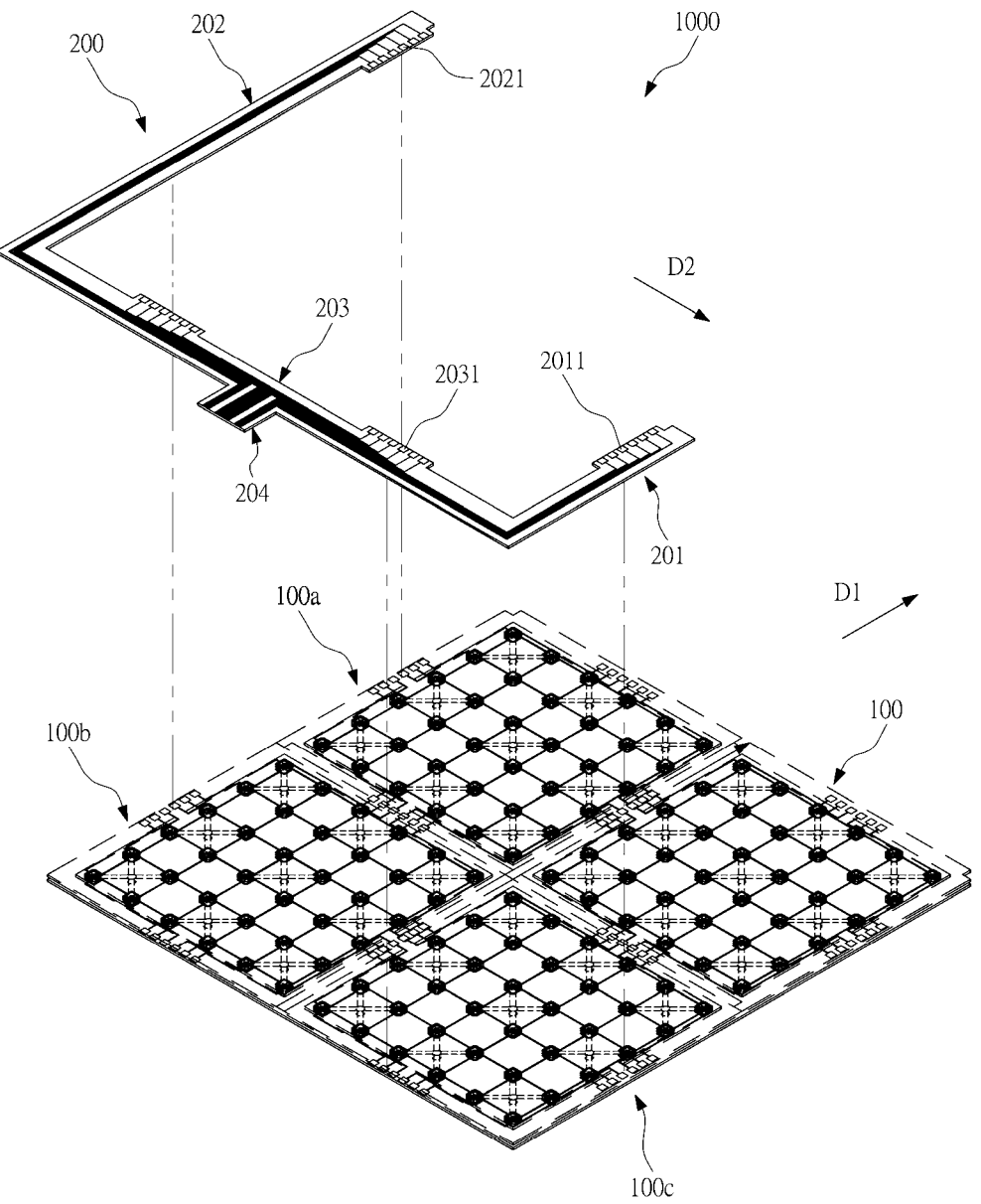
FIG. 5 illustrates, in the spliced pressure sensing device of the present invention, a three-dimensional exploded schematic view of the spliced pressure sensing device body.

Referring to FIG. 4 and FIG. 5, FIG. 4 is a three-dimensional exploded schematic diagram illustrating a plurality of splicable pressure sensing units of the present invention being spliced to each other, and FIG. 5 illustrates, in the spliced pressure sensing device of the present invention, a three-dimensional exploded schematic view of the spliced pressure sensing device body, which is composed of four splicable pressure sensing units, and the flexible connecting component. As shown in FIG. 1 to FIG. 5, the present embodiment further provides a spliced pressure sensing device 1000, including four splicable pressure sensing units 100, 100a, 100b and 100c and a flexible connecting component 200.

As mentioned above, because the structures of the splicable pressure sensing units 100a, 100b and 100c are the same as the structure of the splicable pressure sensing units 100, the structures of the splicable pressure sensing units 100a, 100b and 100c will not be described in detail here.

It should be noted that, among four splicable pressure sensing units 100, 100a, 100b and 100c, the splicing in the first direction D1 is mainly performed by the first end contact and the second end contact, and the splicing in the second direction D2 is mainly performed by the third end contact and the fourth end contact. In practice, the electrical connections can be made by welding and fixing, but it is not limited to this. Conductive adhesive can also be used for the electrical connections, so that the first circuits and the second circuits of four splicable pressure sensing units 100, 100*a*, 100*b* and 100*c* can be respectively connected in series with each other.

The flexible connecting component 200 includes two first connecting straps 201, 202, a second connecting strap 203 and a bus portion 204. The first connecting straps 201 includes six first circuit contacts 2011 (only one shown in the figure), and the first connecting straps 202 similarly includes six first circuit contacts 2021 (only one shown in the figure). Both ends of the second connecting strap 203 are integrally connected to one end of the two first connecting straps 201, 202 respectively, and the second connecting strap 203 extends along the second direction D2 and is provided with twelve second circuit contacts 2031. The bus portion 204 connects to the second connecting strap 203, and the circuitries of the first circuit contacts 2011, 2021 and the second circuit contacts 2031 all extend to the bus portion 204, so that it allows users to connect to other electronic devices such as computers or analytical instruments.

After four splicable pressure sensing units 100, 100*a*, 100*b* and 100*c* are spliced into a spliced pressure sensing device body (not shown in the figure), the flexible connecting component 200 is used to connect adjacent splicable pressure sensing units 100, 100*a*, 100*b* and 100*c*. In the present embodiment, six first circuit contacts 2011 of the first connecting strap 201 are used to electrically connect to six fourth end contacts (not shown in the figure) of the splicable pressure sensing unit 100*c*, and six first circuit contacts 2021 of the first connecting strap 202 are used to electrically connect to six third end contacts (not shown in the figure) of the splicable pressure sensing unit 100*a*. Twelve second circuit contacts 2031 of the second connecting strap 203 are used to electrically connect to six first end contacts (not shown in the figure) of the splicable pressure sensing unit 100*c* and to six first end contacts (not shown in the figure) of the splicable pressure sensing unit 100*b*.

As mentioned above, the splicable pressure sensing unit 100*c* connects with the second circuit (not shown in the figure) of the splicable pressure sensing unit 100*b* in the second direction D2, therefore, when the first circuit contacts 2011 are electrically connected to six fourth end contacts (not shown in the figure) of the splicable pressure sensing unit 100*c*, it is also equivalent to electrically connect to the second circuits of the splicable pressure sensing unit 100*b*. Similarly, when the first circuit contacts 2021 are electrically connected to six third end contacts (not shown in the figure) of the splicable pressure sensing unit 100*a*, it is also equivalent to electrically connect to the second circuits 35 (not shown in FIG. 5) of the splicable pressure sensing unit 100. First circuits (not shown in the figure) of four splicable pressure sensing units 100, 100*a*, 100*b* and 100*c*, which are extended along the first direction D1, are respectively electrically connected because of twelve second circuit contacts 2031. Therefore, four splicable pressure sensing units 100, 100*a*, 100*b* and 100*c* can form a grid-shaped pressure sensing circuit structure, having a larger sensing area than a single splicable pressure sensing unit 100 by twelve sets of first circuits and twelve sets of second circuits.

Additionally, in the present embodiment, although the flexible connecting component 200 includes two first connecting straps 201, 202 and a second connecting strap 203, in other embodiments, it can be only a first connecting strap 202 and a second connecting strap 203. That is to say, the six first circuit contacts 2011 are disposed on the first connecting strap 202 so that the entire flexible connecting component 200 forms an L-shaped structure. At this time, the bus portion 204 can be disposed on the intersection of the first connecting strap 202 and the second connecting strap 203.

In summary, in the spliced pressure sensing device and the splicable pressure sensing unit of the present invention, the first circuits are spliced in the first direction through the first flexible circuit board, and the second circuits are spliced in the second direction through the second flexible circuit board, so that this allows the splicable pressure sensing unit to have a wide variety of splicing combinations, allowing users to adjust the sensing range according to different sensing range requirements. Then, all the first circuits and all the second circuits are connected respectively through the flexible connecting component to form a spliced pressure sensing device with a large sensing range, which is very convenient and full of flexibility in assembly. Compared with the pressure sensing device in the prior art which only has a fixed size and must be re-designed and re-manufactured according to different needs, the spliced pressure sensing device and the splicable pressure sensing unit of the present invention are indeed more convenient and full of flexibility in assembly.

Additionally, because the splicable pressure sensing unit is formed of a flexible material, it can be rolled up and stored for portability, and can be used in various applications.

While the present invention has been particularly shown and described with reference to a preferred embodiment, it will be understood by those skilled in the art that various changes in form and detail may be without departing from the spirit and scope of the present invention.

What is claimed is:

1. A spliced pressure sensing device, comprising:
   a plurality of splicable pressure sensing units, each of the splicable pressure sensing units including:
   a first flexible circuit board, having a plurality of first circuits extending along a first direction, each of the first circuits having a first end contact, a second end contact and a plurality of first sensing contacts connecting with the first end contact and the second end contact in series;
   a flexible spacer layer, having a first adherence surface and a second adherence surface opposite to each other, the first adherence surface adhered to the first flexible circuit board, the flexible spacer layer having a plurality of through holes and a plurality of air escape channels through the first adherence surface and the second adherence surface, each of the air escape channels respectively communicating with one of the through holes, each of the first sensing contacts respectively aligned with corresponding one of the through holes; and
   a second flexible circuit board, adhered to the second adherence surface and having a plurality of second circuits extending along a second direction perpendicular to the first direction, each of the second circuits having a third end contact, a fourth end contact and a plurality of second sensing contacts connecting with the third end contact and the fourth end contact in series, each of the second sensing contacts respectively aligned with corresponding one of the first sensing contacts through one of the through holes; and
   a flexible connecting component, having a plurality of first circuit contacts and a plurality of second circuit contacts, used to connect at least two of the splicable pressure sensing units adjacent to each other after at least two of the splicable pressure sensing units are spliced into a spliced pressure sensing device body, the first circuit contacts electrically connecting with the first circuit, the second circuit contacts electrically connecting with the second circuit;

wherein, in the spliced pressure sensing device body, all of the first circuits electrically connect with each other, and all of the second circuits electrically connect with each other.

2. The spliced pressure sensing device of claim 1, wherein the first flexible circuit board further includes a plurality of first air escape holes, each of the first air escape holes respectively communicating with one of the air escape channels.

3. The spliced pressure sensing device of claim 2, wherein the second flexible circuit board further includes a plurality of second air escape holes, each of the second air escape holes respectively communicating with one of the air escape channels.

4. The spliced pressure sensing device of claim 1, wherein the first flexible circuit board extends from a first side to a second side along the first direction, the first end contact and the second end contact of each of the first circuits respectively arranged on the first side and the second side, the first flexible circuit board further including a third side and a fourth side, the third side and the fourth side respectively connected with two ends of the first side and the second side, the third side further having a first notch, the fourth side further having a second notch, the third end contact of each of the second circuits exposed from the first notch, the fourth end contact of each of the second circuits exposed from the second notch.

5. The spliced pressure sensing device of claim 4, wherein the second flexible circuit board extends from a fifth side to a sixth side along the second direction, the third end contact and the fourth end contact of each of the second circuits respectively arranged on the fifth side and the sixth side, the second flexible circuit board further including a seventh side and an eighth side, the seventh side and the eighth side respectively connected with two ends of the fifth side and the sixth side, the seventh side further having a third notch, the eighth side further having a fourth notch, the first end contact of each of the first circuits exposed from the third notch, the second end contact of each of the first circuits exposed from the fourth notch.

6. The spliced pressure sensing device of claim 1, wherein the flexible connecting component includes:

at least one first connecting strap, extended along the first direction, having the plurality of first circuit contacts; and at least one second connecting strap, connected with at least one of the first connecting strap, extended along the second direction, having the plurality of second circuit contacts.

7. A splicable pressure sensing unit, comprising:

a first flexible circuit board, having a plurality of first circuits extending along a first direction, each of the first circuits having a first end contact, a second end contact and a plurality of first sensing contacts connecting with the first end contact and the second end contact in series;

a flexible spacer layer, having a first adherence surface and a second adherence surface opposite to each other, the first adherence surface adhered to the first flexible circuit board, the flexible spacer layer having a plurality of through holes and a plurality of air escape channels through the first adherence surface and the second adherence surface, each of the air escape channels respectively communicating with one of the through holes, each of the first sensing contacts respectively aligned with corresponding one of the through holes; and a second flexible circuit board, adhered to the second adherence surface and having a plurality of second circuits extending along a second direction perpendicular to the first direction, each of the second circuits having a third end contact, a fourth end contact and a plurality of second sensing contacts connecting with the third end contact and the fourth end contact in series, each of the second sensing contacts respectively aligned with corresponding one of the first sensing contacts through one of the through holes.

8. The splicable pressure sensing unit of claim 7, wherein the first flexible circuit board further includes a plurality of first air escape holes, each of the first air escape holes respectively communicating with one of the air escape channels.

9. The splicable pressure sensing unit of claim 8, wherein the second flexible circuit board further includes a plurality of second air escape holes, each of the second air escape holes respectively communicating with one of the air escape channels.

10. The splicable pressure sensing unit of claim 7, wherein the first flexible circuit board extends from a first side to a second side along the first direction, the first end contact and the second end contact of each of the first circuits respectively arranged on the first side and the second side, the first flexible circuit board further including a third side and a fourth side, the third side and the fourth side respectively connected with two ends of the first side and the second side, the third side further having a first notch, the fourth side further having a second notch, the third end contact of each of the second circuits exposed from the first notch, the fourth end contact of each of the second circuits exposed from the second notch.

11. The splicable pressure sensing unit of claim 10, wherein the second flexible circuit board extends from a fifth side to a sixth side along the second direction, the third end contact and the fourth end contact of each of the second circuits respectively arranged on the fifth side and the sixth side, the second flexible circuit board further including a seventh side and an eighth side, the seventh side and the eighth side respectively connected with two ends of the fifth side and the sixth side, the seventh side further having a third notch, the eighth side further having a fourth notch, the first end contact of each of the first circuits exposed from the third notch, the second end contact of each of the first circuits exposed from the fourth notch.

\* \* \* \* \*